United States Patent
Gokhale et al.

(10) Patent No.: US 11,831,295 B2
(45) Date of Patent: Nov. 28, 2023

(54) MULTIFUNCTIONAL INTEGRATED ACOUSTIC DEVICES AND SYSTEMS USING EPITAXIAL MATERIALS

(71) Applicant: The Government of the United States of America, as represented by the Secretary of the Navy, Arlington, VA (US)

(72) Inventors: Vikrant J. Gokhale, Alexandria, VA (US); Brian P. Downey, Cheverly, MD (US); Matthew T. Hardy, Arlington, VA (US); Eric N. Jin, Alexandria, VA (US); Neeraj Nepal, Woodbridge, VA (US); D. Scott Katzer, Alexandria, VA (US); David J. Meyer, Annandale, VA (US)

(73) Assignee: The Government of the United States of America, as represented by the Secretary of the Navy, Arlington, VA (US)

( * ) Notice: Subject to any disclaimer, the term of this patent is extended or adjusted under 35 U.S.C. 154(b) by 550 days.

(21) Appl. No.: 17/019,611

(22) Filed: Sep. 14, 2020

(65) Prior Publication Data

US 2021/0091746 A1 Mar. 25, 2021

Related U.S. Application Data

(60) Provisional application No. 62/902,996, filed on Sep. 20, 2019.

(51) Int. Cl.
*H03H 9/02* (2006.01)
*H03H 9/24* (2006.01)

(52) U.S. Cl.
CPC .... *H03H 9/02574* (2013.01); *H03H 9/02015* (2013.01); *H03H 9/02976* (2013.01); *H03H 9/2426* (2013.01)

(58) Field of Classification Search
CPC .......... H03H 9/02574; H03H 9/02015; H03H 9/02976; H03H 9/2426
See application file for complete search history.

(56) References Cited

U.S. PATENT DOCUMENTS

2003/0015941 A1* 1/2003 Nakatani ................ H03H 9/173
310/330
2004/0070312 A1 4/2004 Penunuri et al.
(Continued)

OTHER PUBLICATIONS

D. Jena, et al. "The new nitrides: layered, ferroelectric, magnetic, metallic and superconducting nitrides to boost the GaN photonics and electronics eco-system," Japanese Journal of Applied Physics, vol. 58, p. SC0801, May 17, 2019.
(Continued)

*Primary Examiner* — Derek J Rosenau
(74) *Attorney, Agent, or Firm* — US Naval Research Laboratory; Joslyn Barritt

(57) ABSTRACT

Acoustic wave devices based on epitaxially grown heterostructures comprising appropriate combinations of epitaxially grown metallic transition metal nitride (TMN) layers, epitaxially grown Group III-nitride (III-N) piezoelectric semiconductor thin film layers, and epitaxially grown perovskite oxide (PO) layers. The devices can include bulk acoustic wave (BAW) devices, surface acoustic wave (SAW) devices, high overtone bulk acoustic resonator (HBAR) devices, and composite devices comprising HBAR devices integrated with high-electron-mobility transistors (HEMTs).

13 Claims, 11 Drawing Sheets

(56) References Cited

U.S. PATENT DOCUMENTS

| | | | |
|---|---|---|---|
| 2004/0173816 A1* | 9/2004 | Saxler | H03H 9/02976 257/195 |
| 2007/0040473 A1 | 2/2007 | Ballandras et al. | |
| 2010/0052470 A1 | 3/2010 | Andle et al. | |
| 2013/0249648 A1 | 9/2013 | Reinhardt et al. | |
| 2016/0036851 A1 | 2/2016 | Meyer et al. | |
| 2019/0172923 A1 | 6/2019 | Pelzel et al. | |
| 2019/0333965 A1* | 10/2019 | Campanella-Pineda | H01L 21/0254 |

OTHER PUBLICATIONS

R. Matloub, et al., "Piezoelectric Al1—xScxN thin films: A semi-conductor compatible solution for mechanical energy harvesting and sensors," Applied Physics Letters, vol. 102, p. 152903, 2013.

D. S. Katzer, et al., "Molecular Beam Epitaxy of Transition Metal Nitrides for Superconducting Device Applications," physica status solidi (a), vol. 217, p. 1900675, 2020.

M. Brahlek, et al., "Frontiers in the Growth of Complex Oxide Thin Films: Past, Present, and Future of Hybrid MBE," Advanced Functional Materials, vol. 28, p. 1702772, Dec. 21, 2017.

N. I. Polzikova, et al., "Acoustic spin pumping in magnetoelectric bulk acoustic wave resonator," AIP Advances, vol. 6, p. 056306, 2016.

S. Joshi, et al., "Design strategies for controlling damping in micromechanical and nanomechanical resonators," EPJ Techniques and Instrumentation, vol. 1, p. 5, May 23, 2014.

R. Yan, et al., "GaN/NbN epitaxial semiconductor/superconductor heterostructures," Nature, vol. 555, pp. 183-189, 2018.

A. Kochhar, et al., "Wave Propagation Direction and c-Axis Tilt Angle Influence on the Performance of ScAlN/Sapphire-Based SAW Devices," IEEE Transactions on Ultrasonics, Ferroelectrics, and Frequency Control, vol. 63, pp. 953-960, 2016.

J. B. Shealy, et al., "Low loss, 3.7GHz wideband BAW filters, using high power single crystal AlN-on-SiC resonators," In 2017 IEEE MTT-S International Microwave Symposium (IMS), 2017, pp. 1476-1479.

D. P. Kumah, et al., "Epitaxial Oxides on Semiconductors: From Fundamentals to New Devices," Advanced Functional Materials, p. 1901597, 2019.

R. McKee et al., "Crystalline oxides on silicon: the first five monolayers," Physical Review Letters, vol. 81, p. 3014, 1998; Y. Liang et al., "Hetero-epitaxy of perovskite oxides on GaAs (001) by molecular beam epitaxy," Applied physics letters, vol. 85, pp. 1217-1219, 2004.

W. Tian et al., "Epitaxial integration of (0001) BiFeO3 with (0001) GaN," Applied physics letters, vol. 90, p. 172908, 2007.

S. Baek et al., "Giant piezoelectricity on Si for hyperactive MEMS," Science, vol. 334, pp. 958-961, 2011.

K. Eisenbeiser et al., "Crystalline oxide-based devices on silicon substrates," Journal of Electronic Materials, vol. 32, pp. 868-871, 2003.

C. Xiong et al., "Active silicon integrated nanophotonics: ferroelectric BaTiO3 devices," Nano Letters, vol. 14, pp. 1419-1425, 2014.

R. Ranjan et al., "Novel features of Sr1—xCaxTiO3 phase diagram: evidence for competing antiferroelectric and ferroelectric interactions," Physical Review Letters, vol. 84, p. 3726, 2000.

M. Rais-Zadeh et al., "Gallium nitride as an electromechanical material," Journal of Microelectromechanical Systems, vol. 23, pp. 1252-1271, 2014.

J. B. Shealy et al., "Single crystal AlGaN bulk acoustic wave resonators on silicon substrates with high electromechanical coupling," in 2016 IEEE Radio Frequency Integrated Circuits Symposium (RFIC), 2016, pp. 103-106.

A. Ansari et al., "Monolithic integration of GaN-based micromechanical resonators and HEMTs for timing applications," In IEEE International Electron Devices Meeting (IEDM 2012), 2012, pp. 15.5.1-15.5.4.

R. Tabrizian, M. Rais-Zadeh, and F. Ayazi, "Effect of phonon interactions on limiting the f.Q product of micromechanical resonators," International Solid-State Sensors, Actuators and Microsystems Conference, (Transducers 2009), 2009, pp. 2131-2134.

A. Ansari, C.-Y. Liu, C.-C. Lin, H.-C. Kuo, P.-C. Ku, and M. Rais-Zadeh, "GaN Micromechanical Resonators with Meshed Metal Bottom Electrode," Materials, vol. 8, pp. 1204-1212, 2015.

E. N. Jin et al., "Epitaxial growth of SrCaTiO3 films on GaN by molecular beam epitaxy with TiO2 buffer layer," Journal of Applied Physics, vol. 127, p. 214104, 2020.

W. Luo et al., "Improved crystalline properties of laser molecular beam epitaxy grown SrTiO3 by rutile TiO2 layer on hexagonal GaN," Journal of Applied Physics, vol. 106, p. 104120, 2009.

K. M. Lakin et al., "Acoustic bulk wave composite resonators," Applied Physics Letters, vol. 38, pp. 125-127, 1981.

E. Defaÿ, "High Overtone Bulk Acoustic Resonator (HBAR)," in Integration of Ferroelectric and Piezoelectric Thin Films, ed: John Wiley & Sons, Inc., 2013, pp. 297-313.

T. A. Gosavi et al., "HBAR as a high frequency high stress generator," in 2015 IEEE International Ultrasonics Symposium (IUS), 2015, pp. 1-4.

V. J. Gokhale, et al., "Epitaxial bulk acoustic wave resonators as highly coherent multi-phonon sources for quantum acoustodynamics," Nature Communications, vol. 11, p. 2314, 2020.

P. Kharel et al., "High-frequency cavity optomechanics using bulk acoustic phonons," Science Advances, vol. 5, p. eaav0582, 2019.

Y. Chu et al., "Quantum acoustics with superconducting qubits," Science, vol. 358, pp. 199-202, 2017.

E. R. MacQuarrie et al., "Coherent control of a nitrogen-vacancy center spin ensemble with a diamond mechanical resonator," Optica, vol. 2, pp. 233-238, Mar. 20, 2015 2015.

H. Y. Chen et al., "Orbital State Manipulation of a Diamond Nitrogen-Vacancy Center Using a Mechanical Resonator," Physical Review Letters, vol. 120, p. 167401, 2018.

D. S. Katzer et al., "Epitaxial metallic β-Nb2N films grown by MBE on hexagonal SiC substrates," Applied Physics Express, vol. 8, p. 085501, 2015.

B. P. Downey et al., "Epitaxial Transition Metal Nitride/III N Alloys for RF Devices," in GOMACTech, 2019, pp. 592-595.

P. Arrangoiz-Arriola et al., "Microwave Quantum Acoustic Processor," IEEE MTT-S International Microwave Symposium (IMS) 255-258 (IEEE 2019).

B. Kim et al., "Frequency stability of wafer-scale film encapsulated silicon based MEMS resonators," Sensors and Actuators A: Physical, vol. 136, pp. 125-131, 2007.

V. A. Thakar et al., "Piezoelectrically Transduced Temperature-Compensated Flexural-Mode Silicon Resonators," Journal of Microelectromechanical Systems, vol. 22, pp. 815-823, 2013.

C. Lin et al., "Temperature-compensated aluminum nitride lamb wave resonators," IEEE Transactions on Ultrasonics, Ferroelectrics, and Frequency Control, vol. 57, pp. 524-532, 2010.

K. Hashimoto et al., "High-performance surface acoustic wave resonators in the 1 to 3 GHz range using a ScAlN/6H-SiC structure," IEEE Transactions on Ultrasonics, Ferroelectrics, and Frequency Control, vol. 60, pp. 637-642, 2013.

C. C. W. Ruppel, "Acoustic Wave Filter Technology—A Review," IEEE Transactions on Ultrasonics, Ferroelectrics, and Frequency Control, vol. 64, pp. 1390 1400, 2017.

Q. Zhang et al., "Surface acoustic wave propagation characteristics of ScAlN/diamond structure with buried electrode," in Proceedings of the 2014 Symposium on Piezoelectricity, Acoustic Waves, and Device Applications, 2014, pp. 271-274.

A. Qamar et al., "Solidly Mounted Anti-Symmetric Lamb-Wave Delay Lines as an Alternate to SAW Devices," IEEE Electron Device Letters, vol. 39, pp. 1916-1919, 2018.

Search Report and Written Opinion dated Jan. 7, 2021 in corresponding International Application No. PCT/US2020/050626.

* cited by examiner

MULTIFUNCTIONAL INTEGRATED ACOUSTIC DEVICES AND SYSTEMS USING EPITAXIAL MATERIALS

CROSS-REFERENCE

This application is a Nonprovisional of and claims the benefit of priority under 35 U. S.C. § 119 based on U.S. Provisional Patent Application No. 62/902,996 filed on Sep. 20, 2019. The Provisional Application and all references cited herein are hereby incorporated by reference into the present disclosure in their entirety.

FEDERALLY-SPONSORED RESEARCH AND DEVELOPMENT

The United States Government has ownership rights in this invention. Licensing inquiries may be directed to Office of Technology Transfer, US Naval Research Laboratory, Code 1004, Washington, DC 20375, USA; +1.202.767.7230; techtran@nrl.navy.mil, referencing Navy Case #111797.

TECHNICAL FIELD

The present disclosure relates to acoustic and acoustoelectric integrated microsystems using epitaxially grown heterostructures comprising appropriate combinations of epitaxially grown metallic transition metal nitride (TMN) layers, epitaxially grown Group III-Nitride (III-N) piezoelectric semiconductor thin film layers, and epitaxially grown perovskite oxide (PO) layers.

BACKGROUND

Historically, surface acoustic wave (SAW) or bulk acoustic wave (BAW) devices have been used as standalone components of larger systems, owing to the lack of appropriate materials and integration processes that would enable full wafer-scale integration of acoustic materials (popularly piezoelectric or ferroelectric materials) with electronic, photonic, magnetic, or mechanical systems.

Advancing materials science and thin film technology has led to concerted and successful efforts at integrating acoustic devices with other functionalities to a limited extent. Many of these efforts have been focused on integrating sputter deposited piezoelectric materials on analog and digital CMOS systems, in order to create acoustic devices with electronic signal processing capabilities. Numerous potential applications exist for systems that can cover the gamut of electronic, mechanical, photonic, magnetic, or quantum domains. One approach to designing and fabricating such systems is a bottom-up method that integrates a combination of compatible thin-film materials with multi-domain functionality.

Epitaxially grown III-N materials such as aluminum nitride (AlN), gallium nitride (GaN) and scandium aluminum nitride (ScAlN) are among the highest quality thin film piezoelectric materials in use. See D. Jena, et al. "The new nitrides: layered, ferroelectric, magnetic, metallic and superconducting nitrides to boost the GaN photonics and electronics eco-system," *Japanese Journal of Applied Physics*, vol. 58, p. SC0801, May 17, 2019; and R. Matloub, et al., "Piezoelectric $Al_{1-x}Sc_xN$ thin films: A semiconductor compatible solution for mechanical energy harvesting and sensors," *Applied Physics Letters*, vol. 102, p. 152903, 2013.

The TMNs of interest have crystal structures similar to that of the III-Nitrides and growth substrates of choice such as silicon carbide (SiC). The TMN layers are single crystal in nature and have excellent thermal stability, allowing in situ growth along with other compatible semiconductor and/or piezoelectric thin films. See D. S. Katzer, et al., "Molecular Beam Epitaxy of Transition Metal Nitrides for Superconducting Device Applications," *physica status solidi (a)*, vol. 217, p. 1900675, 2020.

Perovskite oxides (PO) (with chemical formula $ABO_3$, where A and B are appropriate constituent materials) are a unique class of multifunctional materials which have been demonstrated to possess a rich variety of properties, including ferroelectricity, ferromagnetism, two-dimensional conduction, high-k dielectric materials, high temperature superconductivity, giant magnetoresistance, and piezoelectricity. See M. Brahlek, et al., "Frontiers in the Growth of Complex Oxide Thin Films: Past, Present, and Future of Hybrid MBE," *Advanced Functional Materials*, vol. 28, p. 1702772, Dec. 21, 2017. Popular PO materials include barium titanate ($BaTiO_3$), strontium titanate ($SrTiO_3$), barium strontium titanate ($BaSrTiO_3$), calcium strontium titanate ($CaSrTiO_3$), and lead zirconium titanate ($PbZrTiO_3$). The integration of acoustic devices with multiferroic PO materials can also enable acoustic spin pumping devices. See N. I. Polzikova, et al., "Acoustic spin pumping in magnetoelectric bulk acoustic wave resonator," *AIP Advances*, vol. 6, p. 056306, 2016.

The ability to grow a piezoelectric or ferroelectric layer on top of a metallic TMN layer allows for acoustic device designs that require a bottom electrode or a buried electrode within the piezoelectric heterostructure. In this implementation of acoustic devices, all epitaxial thin films have low surface and interfacial roughness, a low defect density single-crystal structure, and interfaces between the TMN metal and piezoelectric/ferroelectric film that are close to lattice-matched. These factors reduce acoustic losses due to phonon scattering in the materials and at the interfaces, both of which are fundamental limits on the performance of acoustic devices. See S. Joshi, et al., "Design strategies for controlling damping in micromechanical and nanomechanical resonators," *EPJ Techniques and Instrumentation*, vol. 1, p. 5, May 23, 2014.

The III-N and PO materials are widely used for making electronic and photonic devices, circuits and systems. Along with some PO materials, TMN metals such as niobium nitride ($NbN_x$) and tantalum nitride ($TaN_x$) are known to be good conductors at room temperature, and superconducting at cryogenic temperatures for specific crystalline phases See D. S. Katzer, et al., supra; and R. Yan, et al., "GaN/NbN epitaxial semiconductor/superconductor heterostructures," *Nature*, vol. 555, pp. 183-189, 2018. Thus, this invention describes a pathway for the integration of high performance SAW/BAW devices with semiconductor/superconductor devices, circuits, and systems. Many of the materials used in the heterostructure are excellent thermal conductors, allowing for co-integrated high power electronics.

Microscale phononic or acoustic wave devices are critical and widely used components of RF signal processing, sensing, and quantum systems. Many of these devices are made using piezoelectric materials in order to provide the strongest energy coupling efficiency between the electrical and mechanical domains. While strong piezoelectric materials such as quartz and lithium niobate can be grown as large bulk crystals, it is difficult to scale these materials down to high quality sub-micron thin films. Sub-micron thin films are necessary for designing phononic devices for frequencies greater than 1 GHz. Alternately, polycrystalline materials such as zinc oxide (ZnO), lead zirconium titanate (PbZrTiO$_3$), and polycrystalline AlN can be deposited as submicron films using a number of methods including sol-gel deposition and direct current or reactive RF plasma sputtering.

Apart from the ability to generate sub-micron or micron scale piezoelectric thin films, a key reason for the wide spread adoption of these deposition methods (especially RF sputtering) is the ability to deposit piezoelectric films on top of metal films (such as Al, Cr, Ti, W, or Mo), or on top of silicon-based electronics. Many acoustic devices, especially the higher frequency thickness-extensional mode BAW devices, require the piezoelectric film to be sandwiched between two conducting, often metallic electrodes. Sputter depositing a piezoelectric film on top of a metal (or CMOS) places an upper bound on the process temperature, and limits the choice of electrode materials to refractory metals such as W or Mo.

For wurtzite materials such as AlN, GaN, or ScAlN, the highest piezoelectric coupling coefficients ($k^2$) are obtained when the materials are deposited/grown oriented to the c-axis (perpendicular substrate surface). Films that are tilted off-axis may also introduce energy coupling into acoustic modes other than the primary desired mode (e.g. unwanted shear acoustic wave coupling in longitudinal acoustic wave devices). See A. Kochhar, et al, "Wave Propagation Direction and c-Axis Tilt Angle Influence on the Performance of ScAlN/Sapphire-Based SAW Devices," *IEEE Transactions on Ultrasonics, Ferroelectrics, and Frequency Control*, vol. 63, pp. 953-960, 2016.

In order to deposit a highly c-axis oriented piezoelectric thin film on a refractory metal using plasma sputtering, one has to ensure that the refractory metal film also has a highly oriented structure. For polycrystalline films, a large amount of process optimization is needed to ensure that both the deposited metal film and the deposited piezoelectric film have the appropriate c-axis orientation, and consequently the highest piezoelectric coupling coefficient. Recently, BAW resonators made from epitaxial single-crystal films have shown up to a 20% improvement in $k^2$ when compared to sputter deposited films. See J. B. Shealy, et al., "Low loss, 3.7 GHz wideband BAW filters, using high power single crystal AlN-on-SiC resonators," in 2017 *IEEE MTT-S International Microwave Symposium (IMS)*, 2017, pp. 1476-1479. In spite of considerable performance optimization, deposited polycrystalline piezoelectric thin films do not compare favorably with respect to epitaxial single crystal thin films in other aspects.

Sputter-deposited films have significantly higher defect density, poor thickness control and stoichiometric uniformity, and a significantly higher number of impurities, when compared to their epitaxial counterparts. Such problems are especially pronounced for sputter-deposited films that are very thin (i.e., less than 1 μm thick). These structural deficiencies leads to higher mechanical energy dissipation (see below), limits the practical frequency range for thickness-mode BAW devices, reduces thermal and electrical conductivity due to higher phonon scattering, and limits the chip-scale integration of phononic devices with electronic or optoelectronic devices.

High quality interfaces are also critical in order to couple the desired electrical and magnetic properties of PO films with those of the underlying layers. However, growth of perovskite oxides on other materials is often challenging because of the differences in lattice constants and crystal structure. SrTiO$_3$ (STO) is a widely studied PO that exhibits ferroelectricity under strain, supports surface piezoelectricity, and can be alloyed with different oxides to change its band structure or to induce conductivity. See D. P. Kumah, et al., "Epitaxial Oxides on Semiconductors: From Fundamentals to New Devices," *Advanced Functional Materials*, p. 1901597, 2019.

Much effort has been spent in developing technical approaches to integrate epitaxial STO with conventional semiconductors, starting first with epitaxial growth on Si, followed more recently with epitaxial growth on GaAs, and GaN. See R. McKee et al., "Crystalline oxides on silicon: the first five monolayers," *Physical Review Letters*, vol. 81, p. 3014, 1998; Y. Liang et al., "Hetero-epitaxy of perovskite oxides on GaAs (001) by molecular beam epitaxy," *Applied physics letters*, vol. 85, pp. 1217-1219, 2004; and W. Tian et al., "Epitaxial integration of (0001) BiFeO$_3$ with (0001) GaN," *Applied physics letters*, vol. 90, p. 172908, 2007. Semiconductors with epitaxial STO layers then form the templates for subsequent PO film growth. This has allowed for the integration of oxide-based surface acoustic wave resonators, multiferroic nanocomposites, and micro-electromechanical systems with semiconductors. See S. Baek et al., "Giant piezoelectricity on Si for hyperactive MEMS," *Science*, vol. 334, pp. 958-961, 2011; K. Eisenbeiser et al., "Crystalline oxide-based devices on silicon substrates," *Journal of Electronic Materials*, vol. 32, pp. 868-871, 2003; and C. Xiong et al., "Active silicon integrated nanophotonics: ferroelectric BaTiO$_3$ devices," *Nano Letters*, vol. 14, pp. 1419-1425, 2014.

One particular oxide alloy of interest is SrCaTiO$_3$ (SCTO), a material that has been shown to undergo a phase transition from ferroelectric at low Ca fractions to antiferroelectric at higher fractions. See R. Ranjan et al., "Novel features of Sr$_{1-x}$Ca$_x$TiO$_3$ phase diagram: evidence for competing antiferroelectric and ferroelectric interactions," *Physical Review Letters*, vol. 84, p. 3726, 2000.

A crucial performance-limiting factor for acoustic devices is the rate of energy loss or dissipation. Mechanical energy transduced by, stored in, or transmitted through an acoustic or phononic device is dissipated through a variety of loss mechanisms. The quality factor (Q) is a popular figure of merit that is inversely related to the net energy dissipation of a phononic device. Some of the loss mechanisms such as air damping or anchor/support damping can be eliminated by the combination of optimized operating environment and packaging, and optimized device design.

However, a number of material-dependent energy dissipation mechanisms exist, including internal friction in the device volume, at rough free surfaces of the device, and at any internal interfaces (layer, grain, or phase boundaries, edge or screw dislocations, and inclusions or precipitates) within the device structure. See S. Joshi et al., supra. In addition, there are fundamental scattering processes that cannot be eliminated even in an ideal defect-free material, such as anharmonic phonon-phonon scattering, phonon-electron scattering, and thermoelastic damping.

Generally, to minimize dissipation, the strategy for designing a phononic system is to pick materials with low fundamental losses, then minimize material losses by utilizing optimized deposition/growth/fabrication techniques. Promising recent efforts to minimize internal scattering in phononic devices have aimed at using single crystal piezoelectric films instead of polycrystalline films. Metal organic chemical vapor deposition (MOCVD), metal organic vapor phase epitaxy (MOVPE), and molecular beam epitaxy (MBE) have yielded high quality single crystal AlN, GaN, and ScAlN piezoelectric thin films on compatible substrates such as sapphire and SiC. Such films are generally grown at high temperatures (often ranging from 300° C. to 1200° C.) and require a compatible substrate surface with similar crystal structure and/or atomic surface symmetry. This precludes the use of most metals, and limits the widespread use of metal-piezoelectric heterostructures.

A popular solution is to epitaxially grow the single-crystal piezoelectric thin film on a substrate, then remove the substrate partially or fully using etching techniques such as reactive ion etching or ion-milling, and finally use low-temperature physical vapor deposition techniques to deposit a metal electrode on the underside of the piezoelectric film. See M. Rais-Zadeh et al., "Gallium nitride as an electromechanical material," *Journal of Microelectromechanical Systems*, vol. 23, pp. 1252-1271, 2014; and J. B. Shealy et al., "Single crystal AlGaN bulk acoustic wave resonators on silicon substrates with high electromechanical coupling," in 2016 *IEEE Radio Frequency Integrated Circuits Symposium (RFIC)*, 2016, pp. 103-106.

One solution involving direct synthesis is to deposit single-crystal piezoelectric films on doped Si substrates (with <111> orientation in order to provide a similar hexagonal atomic arrangement similar to the hexagonal wurtzite piezoelectric films). See Rais-Zadeh et al., supra; see also J. B. Shealy et al., supra; and A. Ansari et al., "Monolithic integration of GaN-based micromechanical resonators and HEMTs for timing applications," in *IEEE International Electron Devices Meeting (IEDM* 2012), 2012, pp. 15.5.1-15.5.4.

However, this technique has been implemented with only limited success. The III-N/Si interface still has a non-trivial lattice mismatch (~15% to ~20%) leading to degraded piezoelectric properties. Doped <111> Si is not as conductive as metals, making it a poor choice as an electrode, and lastly, Si has significantly higher phonon scattering compared to SiC, sapphire, and diamond. See R. Tabrizian, M. Rais-Zadeh, and F. Ayazi, "Effect of phonon interactions on limiting the f.Q product of micromechanical resonators," *International Solid-State Sensors, Actuators and Microsystems Conference, (TRANSDUCERS* 2009), 2009, pp. 2131-2134.

Attempts to deposit single crystal piezoelectric thin films over a meshed W/SiO$_2$ electrode using MOCVD have also had only limited success, and such films will have a larger loss due to the increased number of interfaces, and due to void formation in the piezoelectric film. See A. Ansari, C.-Y. Liu, C.-C. Lin, H.-C. Kuo, P.-C. Ku, and M. Rais-Zadeh, "GaN Micromechanical Resonators with Meshed Metal Bottom Electrode," *Materials*, vol. 8, pp. 1204-1212, 2015.

A recently reported technique demonstrates the epitaxial growth of a crystalline rare earth oxide (cREO)-metal-semiconductor heterostructure on a substrate (see R. Pelzel et al., United States Patent Application Publication No. 2019/0172923, "Integrated Epitaxial Metal Electrodes," (2019)), but the addition of the cREO between the functional layers and the substrate introduces an electrically and thermally insulating interlayer in the heterostructure, which reduces functionality and power handling capability.

SUMMARY

This summary is intended to introduce, in simplified form, a selection of concepts that are further described in the Detailed Description. This summary is not intended to identify key or essential features of the claimed subject matter, nor is it intended to be used as an aid in determining the scope of the claimed subject matter. Instead, it is merely presented as a brief overview of the subject matter described and claimed herein.

The present invention provides approaches for designing high quality multifunctional acoustic and acoustoelectric integrated microsystems using epitaxially grown heterostructures comprising appropriate combinations of epitaxially grown metallic transition metal nitride (TMN) layers, epitaxially grown Group III-nitride (III-N) piezoelectric semiconductor thin film layers, and epitaxially grown perovskite oxide (PO) layers. Acoustic wave or phononic devices are critical components of radio frequency (RF) signal processing systems, integrated sensors, and quantum computing systems. The use of III-N, PO, and TMN layers in the same heterostructure enables a number of useful multifunctional device configurations, while the epitaxial nature of the heterostructure improves acoustic performance and significantly reduces loss in the system.

DETAILED DESCRIPTION

The aspects and features of the present invention summarized above can be embodied in various forms. The following description shows, by way of illustration, combinations and configurations in which the aspects and features can be put into practice. It is understood that the described aspects, features, and/or embodiments are merely examples, and that one skilled in the art may utilize other aspects, features, and/or embodiments or make structural and functional modifications without departing from the scope of the present disclosure.

The present invention provides approaches for designing high quality multifunctional acoustic and acoustoelectric integrated microsystems using epitaxially grown heterostructures comprising appropriate combinations of epitaxially grown metallic transition metal nitride (TMN) layers, epitaxially grown Group III-nitride (III-N) piezoelectric semiconductor thin film layers, and epitaxially grown perovskite oxide (PO) layers. Acoustic wave or phononic devices are critical components of radio frequency (RF) signal processing systems, integrated sensors, and quantum computing systems. The use of III-N, PO, and TMN layers in the same heterostructure enables a number of useful multifunctional device configurations, while the epitaxial nature of the heterostructure improves acoustic performance and significantly reduces loss in the system.

Recently, it has been shown that an epitaxial metal layer can be epitaxially grown directly on a SiC substrate as part of an epitaxial metal-semiconductor heterostructure. See R. Yan et al., supra. The resulting BAW or SAW device has void-free films with controllable crystalline orientation, high crystallinity, low defect density, low surface and interface roughness, resulting in extremely low levels of material loss and improved power handling. The use of a fully epitaxial heterostructure allows for a higher degree of control on the crystalline orientation of the piezoelectric film, improving the effective piezoelectric coupling and reducing the number of unwanted acoustic modes that are transduced.

Figure 1:
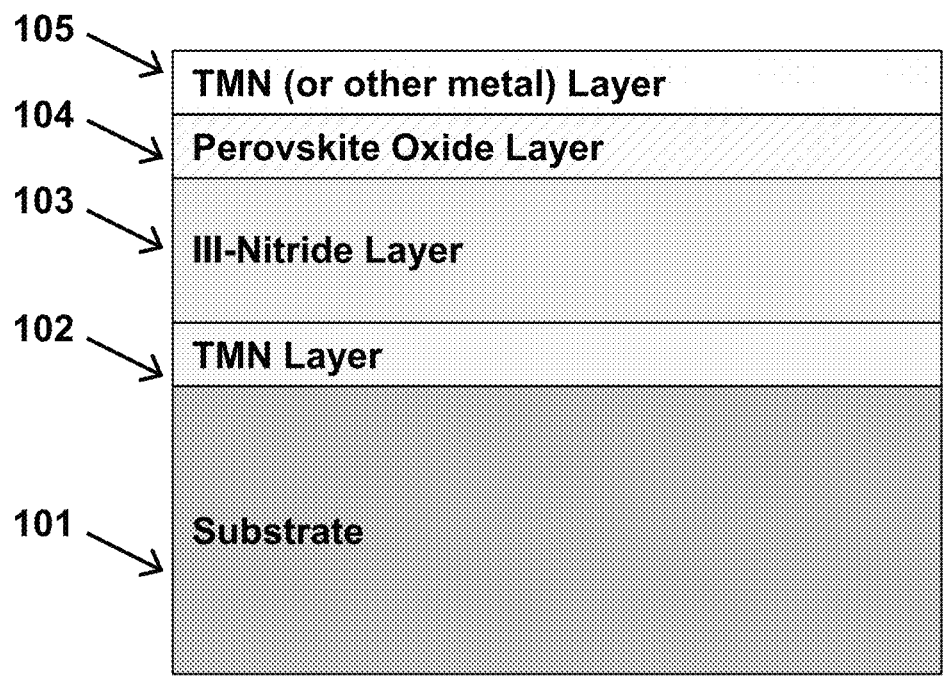
FIG. 1 depicts a cross-sectional schematic of an exemplary solid heterostructure that includes TMN/PO/III-N/TMN layers grown epitaxially on a substrate in accordance with the present invention.

The block schematic in FIG. 1 illustrates an exemplary embodiment of an epitaxially grown piezoelectric heterostructure that can be used in a multifunctional integrated acoustic device. As illustrated in FIG. 1, in accordance with the present invention, such a heterostructure can include a low acoustic loss substrate 101, a first epitaxial TMN layer 102, a second epitaxial TMN layer 105, and an intermediate epitaxial III-Nitride (III-N) layer 103 and/or an intermediate epitaxial perovskite oxide (PO) layer 104 disposed between the first and second TMN layers, where the first and second TMN layers can function as bottom and top electrodes, respectively, and the intermediate III-N layer can function as a piezoelectric layer. In some embodiments, the structure can include only epitaxial III-N layer 103 or only epitaxial PO layer 104, while in other embodiments, both the III-N and PO layers can be included. In some embodiments, III-N layer 103 is grown on first TMN layer 102, with PO layer 104 being grown on the III-N layer, while in other embodiments, the order of III-N layer 103 and PO layer 104 can be inverted, i.e., PO layer 104 can be grown on first TMN layer 102, followed by growth of III-N layer 103 on the PO layer.

It should be noted that each of the layers described above may require additional nucleation layers or template layers of a similar nature in order to achieve the best performance. For example, in some embodiments a high quality GaN layer often requires a very thin AlN layer as a buffer, while in other embodiments, the integration of cubic PO layers onto hexagonal III-N layers may require the use of a suitable strain-relieving buffer layer (e.g., the $TiO_2$ buffer layer in SCTO-on-GaN). Such additional template layers are known to be included in the epitaxial growth process, and are not separately described here.

The heterostructure illustrated in FIG. 1 is a classical unreleased piezoelectric transducer structure, with either III-N layer 103 or PO layer 104 being formed from a piezoelectric material, and is the starting point for the majority of SAW and BAW devices in accordance with the present invention. In some embodiments, PO layer 104 could be used as a piezoelectric layer, while in other embodiments it can be used as an additional multifunctional layer, leveraging its multiferroic or dielectric properties.

Specific preferred and alternative materials for each layer are as given in Table I below.

TABLE I

| Layer # | Function | Preferred Material | Alternative Materials |
| --- | --- | --- | --- |
| 1 | Low-loss Substrate | SiC | Sapphire, Diamond, AlN, GaN, or Si |
| 2 | Bottom Electrode | $NbN_x$ or $TaN_x$ | $WN_x$, $MoN_x$, TMN ternary compounds, and combinations thereof |
| 3 | Piezoelectric | GaN | Any III-N materials or ternary compounds thereof, including AlN, AlGaN, ScAlN, InN, ScN, and YAlN |
| 4 | Perovskite Oxide | $SrCaTiO_3$ | $SrTiO_3$, $BaTiO_3$, $SrCaTiO_3$, or $PbZrTiO_3$ |
| 5 | Top Electrode | $NbN_x$ or $TaN_x$ | $WN_x$, $MoN_x$, and TMN ternary compounds and combinations thereof. Any other metals such as Al, Au, Cr, Ti etc. can also be deposited |

As a reduction to practice, we demonstrate the epitaxial growth of a PO/III-N heterostructure and a III-N/TMN heterostructure, both on SiC. We have demonstrated the first epitaxial growth of the single crystalline material SCTO on GaN via plasma-assisted oxide molecular beam epitaxy (MBE), with a thin $TiO_2$ buffer layer between the SCTO and the GaN. See E. N. Jin et al., "Epitaxial growth of $SrCaTiO_3$ films on GaN by molecular beam epitaxy with $TiO_2$ buffer layer," *Journal of Applied Physics*, vol. 127, p. 214104, 2020.

A well-developed STO-GaN (or SCTO-GaN) template is the first step for further integration of other oxide materials of interest. Because GaN has a wurtzite crystal structure and STO (or SCTO) has a cubic structure with a considerably different lattice constant, a buffer layer is necessary to minimize lattice mismatch and to prevent polycrystalline film formation. See W. Luo et al., "Improved crystalline properties of laser molecular beam epitaxy grown $SrTiO_3$ by rutile $TiO_2$ layer on hexagonal GaN," *Journal of Applied Physics*, vol. 106, p. 104120, 2009.

Figure 2A:
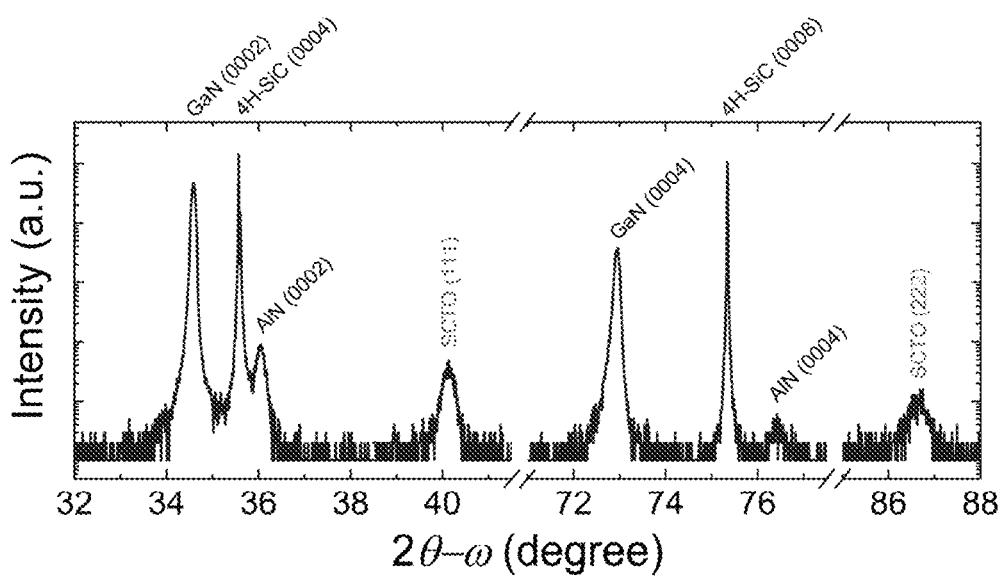
FIGS. 2A and 2B are plots illustrating the results of X-ray diffraction (XRD) analysis of a SrCaTiO$_3$ (SCTO) film grown on a GaN template in accordance with the present invention.
Figure 2B:
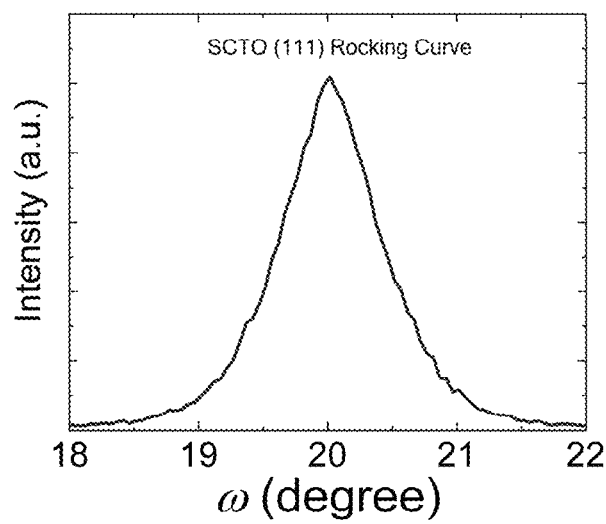

FIGS. 2A and 2B are plots illustrating the results of analysis of an exemplary epitaxial SCTO film grown on a GaN template in accordance with the present invention.

The plot FIG. 2A shows an X-ray diffraction (XRD) line scan of a 39 nm SCTO film grown on a GaN template. The particular sample analyzed for FIG. 2A has a 19% Ca fraction (x=0.19) as determined from X-ray photoelectron spectroscopy. The oxide film is single crystalline, as evidenced by the (111) and (222) oxide Bragg peaks, and lack of any other peaks that would indicate polycrystalline grains.

The plot in FIG. 2B shows an XRD rocking curve taken on the SCTO (111) Bragg peak. A full width at half maximum (FWHM) of 0.92° is measured, a value that is comparable with rocking curve FWHM values measured for STO/GaN films. See Luo et al., supra.

When this oxide film is deposited directly on GaN, polycrystallinity is observed, both in reflection high-energy electron diffraction and in XRD, see E. N. Jin et al., supra.

Epitaxially growing a $TiO_2$ buffer layer between the SCTO and the GaN layer minimizes the reaction of oxygen with the GaN surface during growth. Thus, in accordance with the present invention, in some embodiments, a half monolayer of Ti metal is first deposited on the GaN surface before any oxygen is introduced into the vacuum chamber in order to protect the GaN surface from unwanted oxidation. Subsequent $TiO_2$ is deposited until a layer of TiO is formed on the GaN surface. Using as guidance the approach known in the art used to integrate STO with Si, see R. McKee et al, supra, the inventors have found that a thickness of 1 nm and a growth temperature of 500° C. are the optimal thickness and temperature, respectively, of this $TiO_2$ layer to aid in the production of the highest quality SCTO films deposited on the GaN layer.

Figure 3A:
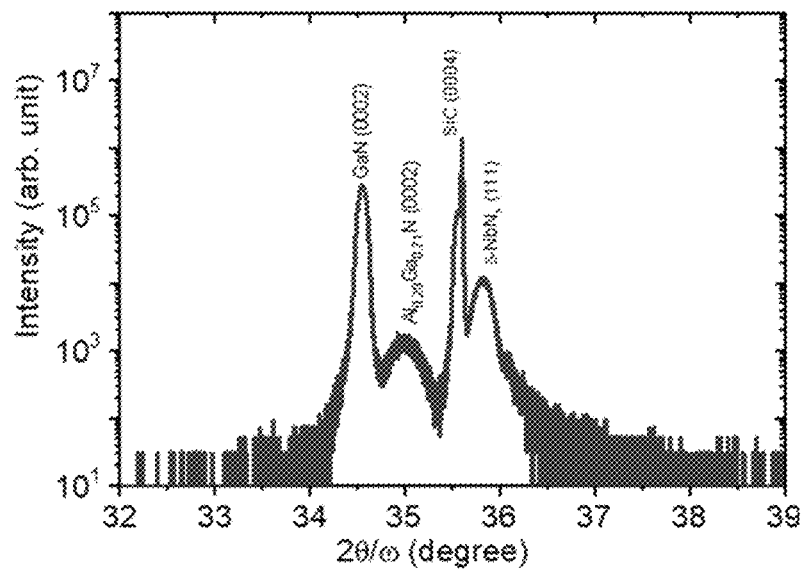
FIGS. 3A and 3B are plots illustrating the results of XRD analysis of a AlGaN/GaN/NbN/SiC heterostructure grown by MBE used for making an exemplary high overtone bulk acoustic resonator (HBAR) bulk acoustic wave (BAW) resonator in accordance with the present invention.
Figure 3B:
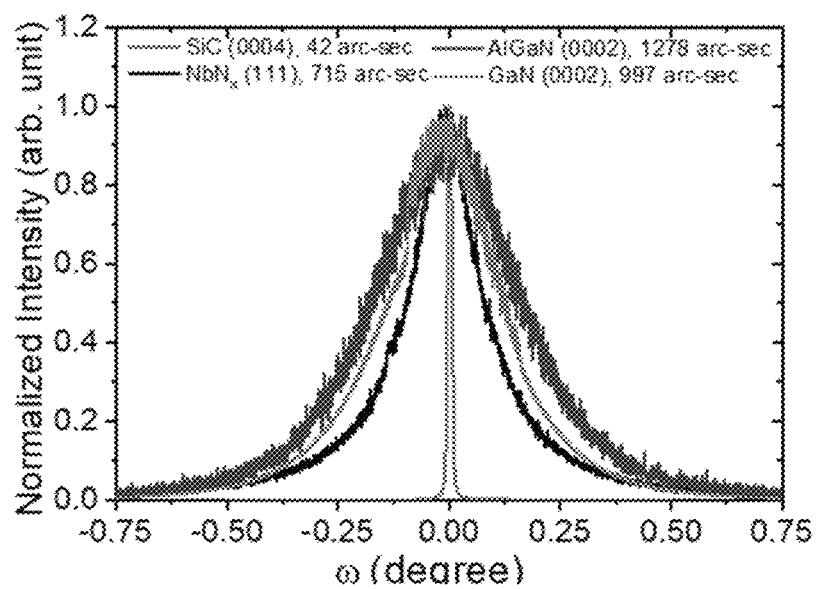

Similarly, FIGS. 3A and 3B illustrate the results of XRD analysis of the AlGaN/GaN/NbN/SiC heterostructure grown by MBE used for making the exemplary HBAR BAW resonator described below, indicating the appropriate material diffraction peaks, and the crystal quality of the same. The XRD data in FIG. 3A demonstrate that all materials in the heterostructure are single crystal and the III-N piezoelectric materials are properly c-axis oriented. The XRD rocking curves in FIG. 3B demonstrate the high crystal quality of each successively grown layer with FWHM values on the NbN and GaN less than 0.2° and 0.3°, respectively. Typical FWHM values for metals and piezoelectric materials deposited by sputtered materials typically exceed 1°.

The simplest form of a BAW device using this epitaxial method uses an epitaxial heterostructure such as that illustrated in FIG. 1, with either the III-N or PO as the piezoelectric, where the heterostructure forms a mechanical cavity resonator popularly known as a high overtone bulk acoustic resonator (HBAR) or an over-moded resonator (OMR) or a composite resonator. See K. M. Lakin et al., "Acoustic bulk wave composite resonators," *Applied Physics Letters*, vol. 38, pp. 125-127, 1981; and E. Defaÿ, "High Overtone Bulk Acoustic Resonator (HBAR)," in *Integration of Ferroelectric and Piezoelectric Thin Films*, ed: John Wiley & Sons, Inc., 2013, pp. 297-313.

Figure 4A:
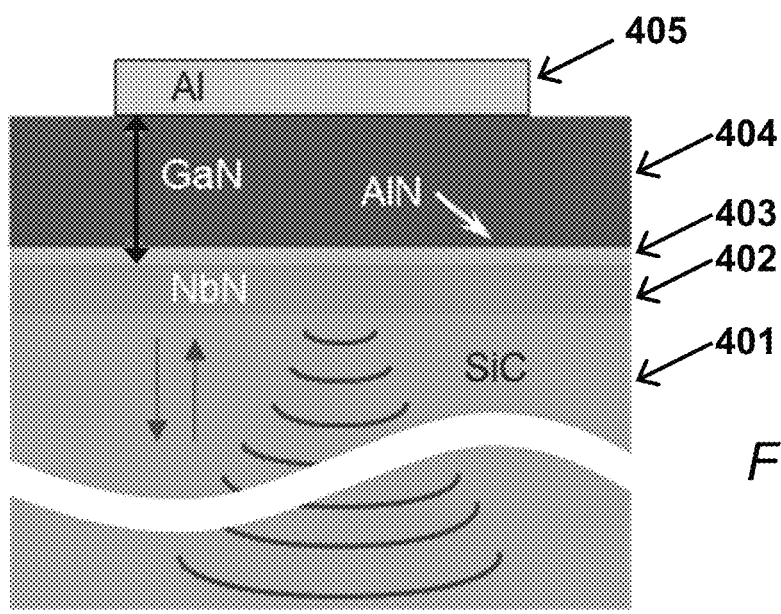
FIGS. 4A-4C illustrate aspects of an exemplary HBAR formed using an epitaxial Al/GaN/AlN/NbN heterostructure on SiC fabricated in accordance with the present invention.

The block schematic in FIG. 4A illustrates aspects of an exemplary HBAR formed using an epitaxial Al/GaN/AlN/NbN heterostructure on SiC fabricated in accordance with the present invention.

In the exemplary embodiment illustrated in FIG. 4A, the heterostructure includes a SiC substrate 401, NbN or other TMN electrode layer 402 on an upper surface of the SiC substrate, AlN nucleation layer 403 on an upper surface of the NbN layer, GaN piezoelectric layer 404 on an upper surface of the AlN layer, and top Al electrode 405 on an upper surface of the GaN layer. All layers in the heterostructure other than the top Al electrode are epitaxially grown using MBE, whereas Al electrode 405 is deposited on top of the structure using electron beam evaporation and liftoff.

Figure 4B:
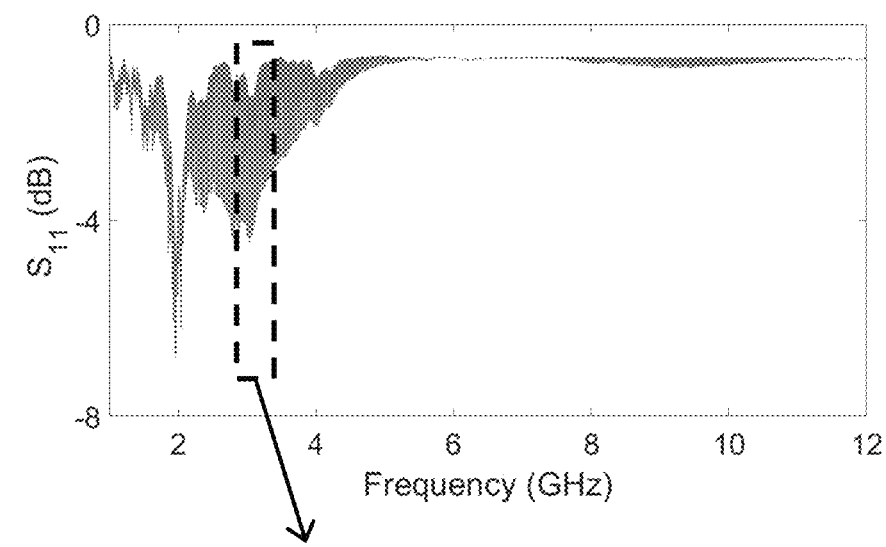

FIG. 4B is a plot depicting the measured RF reflected power of a passive 1-port Al/GaN/AlN/NbN/SiC HBAR as in FIG. 4A operating from L-band through X-band, demonstrating that such a structure exhibits a large number of sharp periodic phononic modes in the L-X band.

The characteristic HBAR response can be observed: a large number of sharp phonon modes ($f_m$) in the L-X band convolved with the transduction envelope of the Al/GaN/NbN transducer. See Lakin, supra.

Figure 4C:
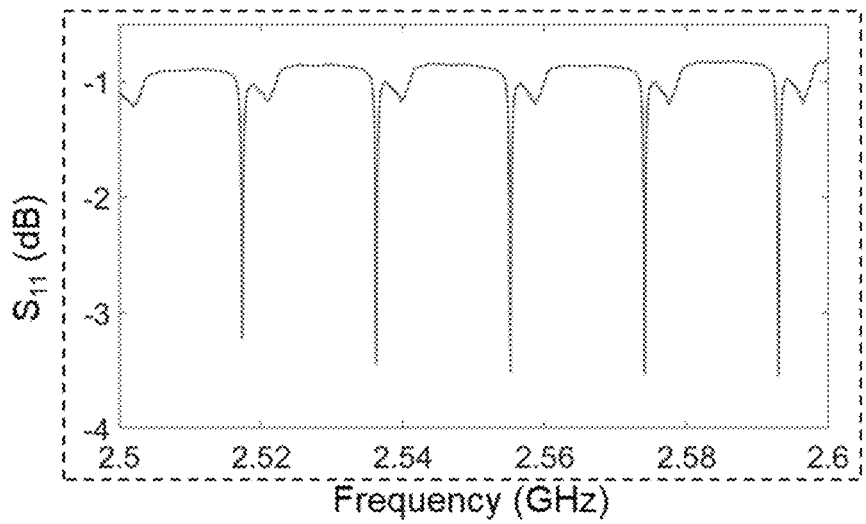

FIG. 4C is a magnified view of some of the periodic modes shown in FIG. 4B, and that clearly indicates the sharpness (and hence Q) of those phonon modes. The mode spacing is given by $\Delta f = (v_s/2t_s)$, where $v_s$ and $t_s$ are the longitudinal velocity and thickness, respectively, of the substrate.

The product of frequency and Q (f×Q) for any given mode is a figure of merit that is inversely proportional to the total mechanical loss in the system. See Joshi et al., supra; see also V. B. Braginsky et al., "Mechanical Oscillators with Small Dissipation," in *Systems with Small Dissipation*, K. S. Thorne, Ed., ed Chicago, Ill., USA: The University of Chicago Press, pp. 1-42; and R. Tabrizian et al., "Effect of phonon interactions on limiting the f.Q product of micromechanical resonators," in *International Solid-State Sensors, Actuators and Microsystems Conference (Transducers)*, Denver, Colo., 2009, pp. 2131-2134. HBARs have regularly returned f×Q values higher than comparable film bulk acoustic resonators (FBARs) or SAW devices by almost two orders of magnitude. See Defaÿ, supra; see also T. A. Gosavi et al., "HBAR as a high frequency high stress generator," in 2015 *IEEE International Ultrasonics Symposium (IUS)*, 2015, pp. 1-4.

In the exemplary embodiment of FIG. 4B and FIG. 4C, $f \times Q > 2 \times 10^{15}$ Hz at room temperature, and $f \times Q > 1.3 \times 10^{17}$ Hz at 7.2 K have been reported. See V. J. Gokhale, et al., "Epitaxial bulk acoustic wave resonators as highly coherent multi-phonon sources for quantum acoustodynamics," *Nature Communications*, vol. 11, p. 2314, 2020. These epi-HBAR f×Q values are higher than the best reported values in the literature for SAW and BAW resonators, including reported values for conventionally sputtered HBARs.

As noted above, in many embodiments, with the exception of the top Al electrode, the entirety of an HBAR heterostructure in accordance with the present invention is grown epitaxially using MBE processes. In some embodiments, such as that shown in FIG. 1, the top electrode can be an epitaxial TMN layer, while in other embodiments, other metals can be used as the top electrode to enhance device performance. Since there are no further epitaxial layers to be grown on it, the top metal can be easily deposited using any other material deposition processes such as electron beam evaporation and liftoff. The top electrode could be patterned into an appropriate size and shape to reduce parasitic lateral acoustic modes, and to provide electrical impedance matching for any interface circuits. In some embodiments, the III-N or PO piezoelectric layer can optionally be etched into a particular shape.

The HBAR combines the strong coupling efficiency of a piezoelectric transducer with the high mechanical Q of a low-loss substrate. The HBAR is a simple BAW device comprised of a metal/piezoelectric/metal transducer on top of a solid low-loss substrate. The transducer launches acoustic energy into the substrate, which efficiently confines all n cavity modes given by $f_n = n \times (v_s/2t_s)$. Thus, the HBAR provides multiple periodic phonon modes, with periodic intermodal spacing.

In general, the epitaxial III-N and/or PO layer or layers need not be used (or used solely) as piezoelectric elements for generating acoustic waves. These materials are widely used as the basis for electronic devices, power electronics, photonics and optoelectronics. Further, TMN materials such as NbN$_x$ and TaN$_x$ well as III-N/TMN heterostructures, are known to be superconducting at temperatures in the 4 K-16 K range. See R. Yan et al., supra. Either or both of the TMN layers 102 and 105 can be used to form superconducting junctions and other superconducting circuits which can then be intimately integrated with the functionality of the III-N based device. For example, a superconducting Josephson junction made on the surface of the heterostructure using the top TMN electrode 105, can be interfaced with any electronic/photonic/phononic element made using the TMN/III-N/TMN, TMN/PO/TMN, or TMN/PO/III-N/TMN heterostructure.

Quantum acoustic/phononic devices have recently been shown to couple strongly and with high coherence to superconducting qubits (see P. Kharel et al., "High-frequency cavity optomechanics using bulk acoustic phonons," *Science Advances*, vol. 5, p. eaav0582, 2019 and Y. Chu et al., "Quantum acoustics with superconducting qubits," *Science*, vol. 358, pp. 199-202, 2017) and with electronic spin (see T. A. Gosavi et al., supra; E. R. MacQuarrie et al., "Coherent control of a nitrogen-vacancy center spin ensemble with a diamond mechanical resonator," *Optica*, vol. 2, pp. 233-238, 2015/03/20 2015; E. R. MacQuarrie et al., "Mechanical Spin Control of Nitrogen-Vacancy Centers in Diamond," *Physical Review Letters*, vol. 111, p. 227602, 2013; and H. Y. Chen et al., "Orbital State Manipulation of a Diamond Nitrogen-Vacancy Center Using a Mechanical Resonator," *Physical Review Letters*, vol. 120, p. 167401, 2018). The integration of high k$^2$ and high Q acoustic devices with superconducting materials, low loss substrates, and high performance electronics can enable new integrated systems for quantum metrology, computing, and communications.

Figure 5:
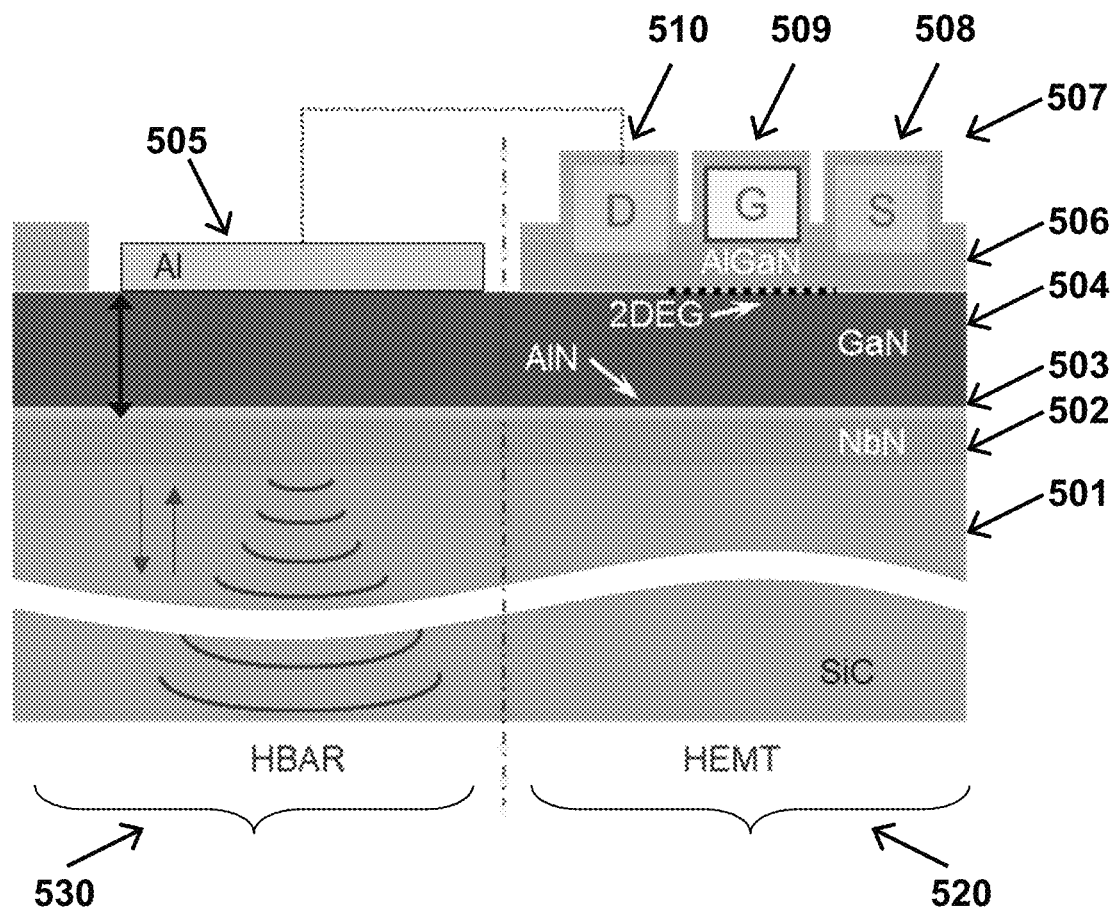
FIG. 5 is a block schematic illustrating an exemplary high electron mobility transistor (HEMT) having an HBAR integrated therewith in accordance with the present invention integrated therein.

Another example of multi-functional integration using such a heterostructure is the integration of a GaN HBAR with an AlGaN/GaN high-electron mobility transistor (HEMT), as illustrated by the block schematic shown in FIG. 5. In such a device, the HBAR and HEMT can be interfaced either electrically (via coplanar waveguides on the surface), or electromechanically (via strain induced modulation of the 2DEG).

As shown in FIG. 5, an exemplary integrated HEMT+HBAR structure can include a HEMT structure 520 fabricated using any suitable GaN HEMT fabrication procedure known in the art, and includes a SiC substrate 501, a near-lattice-matched NbN layer 502 disposed on an upper surface of SiC substrate 501, an AlN nucleation layer 503 disposed on an upper surface of NbN layer 502, a layer of high-quality GaN 504 on an upper surface of AlN layer 503, an AlGaN barrier layer 506 on an upper surface of GaN layer 504, and source, gate, and drain electrodes 508, 509, and 510 being formed on an upper surface of the AlGaN barrier layer 506. In some embodiments, the HEMT can be passivated by a SiN$_x$ layer 507 deposited by plasma-enhanced chemical vapor deposition. See D. S. Katzer et al., "Epitaxial metallic β-Nb2N films grown by MBE on hexagonal SiC substrates," *Applied Physics Express*, vol. 8, p. 085501, 2015; and B. P. Downey et al., "Epitaxial Transition Metal Nitride/III N Alloys for RF Devices," in *GOMACTech,* 2019, pp. 592-595.

After the HEMT structure 520 in the device is fabricated, the area of the structure comprising the HBAR 530 is lithographically defined, AlGaN barrier layer 506 and SiN$_x$ passivation layer 507 are removed using separate plasma etches, and the top HBAR electrode 505 is deposited using electron beam evaporation and liftoff. The strain of the AlGaN layer on GaN creates a polarization discontinuity at the interface between the two materials, and is compensated locally by a two dimensional electron (or hole) gas (2DEG). The HBAR and HEMT can be interfaced electrically via electrical waveguides on the surface, leading to an HBAR that can be directly amplified on-chip by the HEMT.

The two devices can also be coupled electromechanically, wherein the strain waves generated by the HBAR modulate the density of the 2DEG in the HEMT, thus modulating the transconductance of the HEMT itself. The net modulation of the HEMT+HBAR transconductance is the combination of this electrical and/or electromechanical coupling. Various possible design configurations allow us to optimize for one or the other, or both coupling modes, depending on the application. For instance, in an exemplary electromechanically coupled integrated HEMT+HBAR structure used as a resonant sensor, the HEMT could detect and amplify the acoustic mode created by the HBAR, and any perturbations to the same based on an external perturbation, improving detection sensitivity and resolution. See S. Ballandras, et al., "High overtone Bulk Acoustic Resonators built on single crystal stacks for sensors applications," in *IEEE Sensors,* 2011, pp. 516-519. In the specific instance shown in FIG. 5, the heterostructure is AlGaN/GaN/NbN/SiC, with surface metallization to implement electrode and bond pads for both the HEMT and HBAR.

Figure 6A:
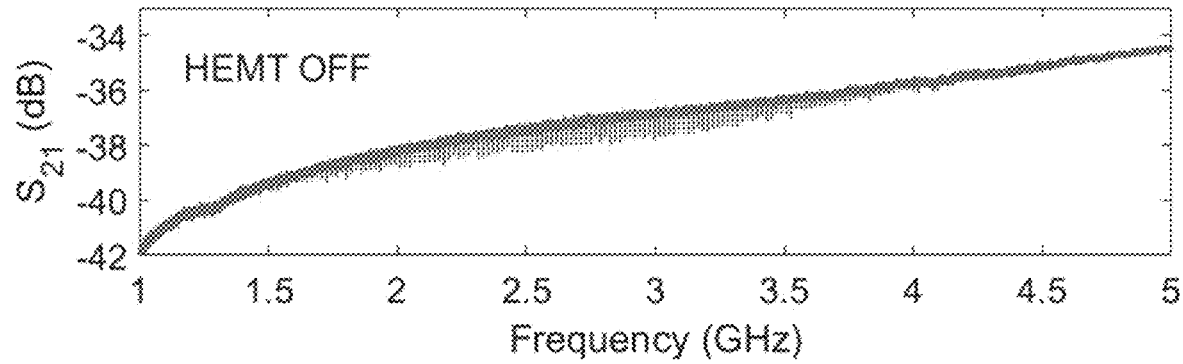
FIGS. 6A and 6B are plots showing the transmission coefficient of an exemplary integrated HEMT+HBAR structure with the HEMT OFF (FIG. 6A) and ON ($V_{gs}$=−1.5 V; $V_{ds}$=10 V) (FIG. 6B).
Figure 6B:
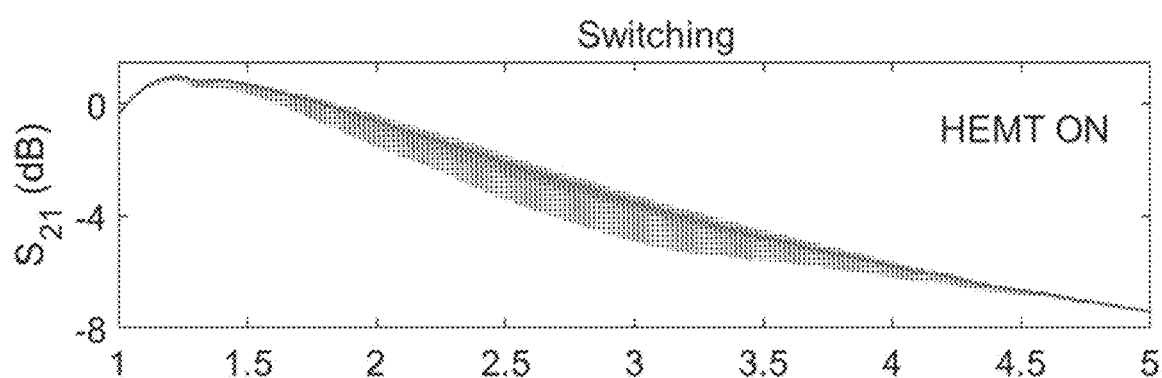

The plots in FIGS. 6A and 6B show the transmission coefficient for an exemplary integrated HEMT+HBAR structure with the HEMT OFF (FIG. 6A) and ON ($V_{gs}$=−1.5 V; $V_{ds}$=10 V) (FIG. 6B). As can be seen from FIG. 6B, there is ~34 dB difference in signal transmission (@ 3 GHz) when the HEMT is switched on compared to the off-state, while retaining the dense, periodic, multi-mode spectral structure of the HBAR.

Figure 7A:
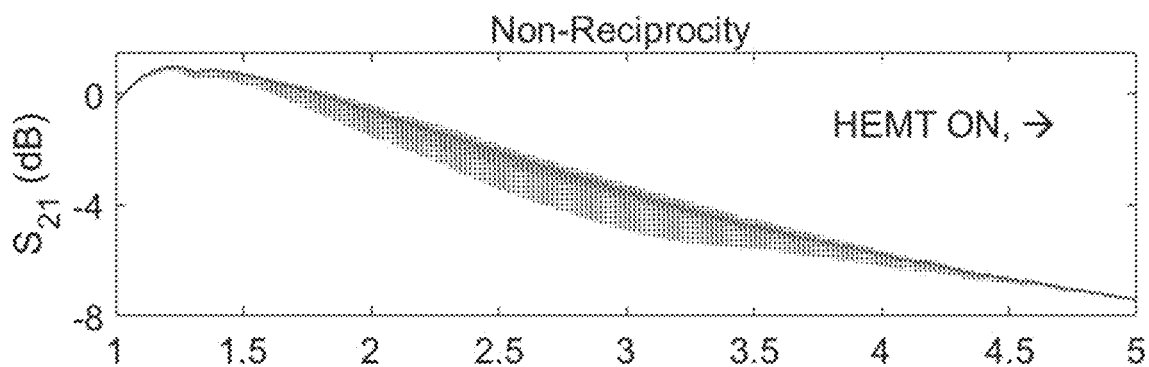
FIGS. 7A and 7B are plots showing a comparison between the forward (FIG. 7A) and reverse (FIG. 7B) transmission spectra for an exemplary integrated HEMT+HBAR structure with the HEMT ON (Vgs=−1.5 V; Vds=10 V).
Figure 7B:
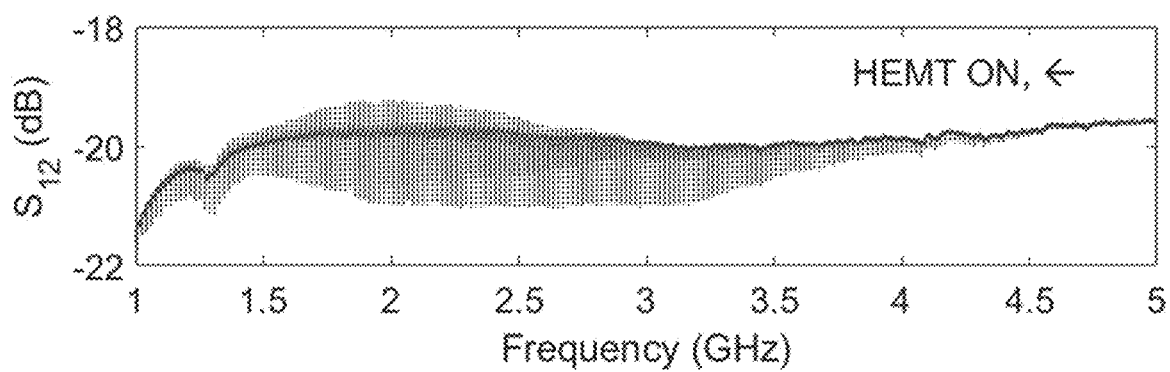

The plots in FIGS. 7A and 7B show a comparison between the forward (FIG. 7A) and reverse (FIG. 7B) transmission spectra for an exemplary integrated HEMT+HBAR structure in which the HEMT is ON (Vgs=−1.5 V; Vds=10 V). The HEMT+HBAR structure is highly non-reciprocal, with ~16 dB of directional contrast (@ 3 GHz) with the HEMT switched ON.

Although such non-reciprocal behavior is expected for a HEMT amplifier, it is unusual for passive mechanical resonators.

Figure 8:
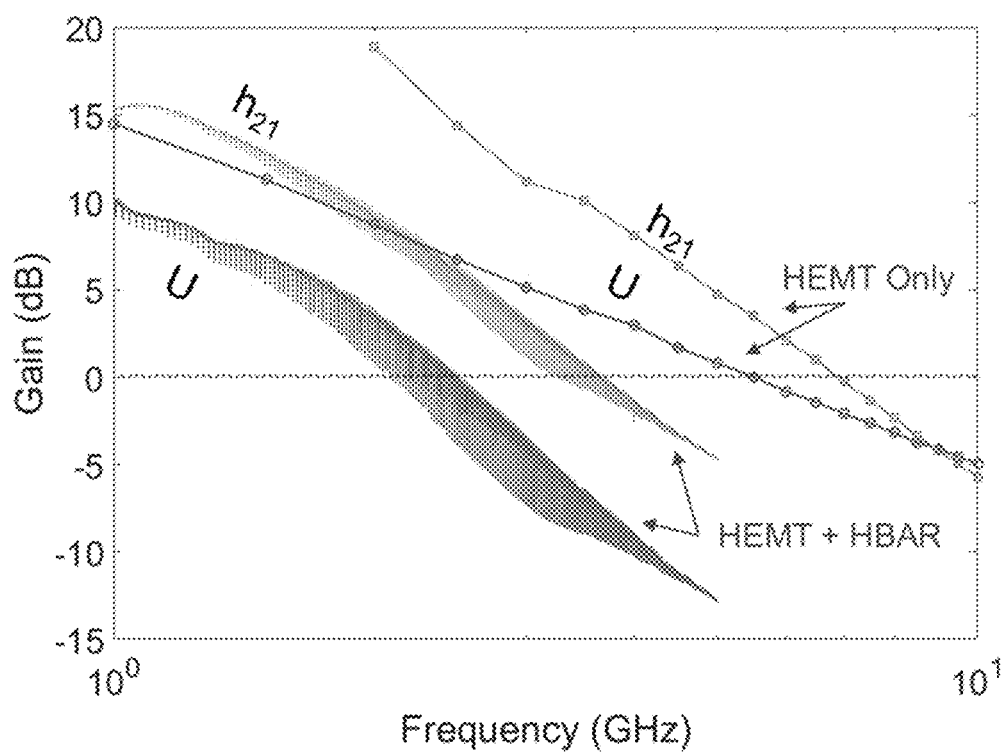
FIG. 8 is a plot showing the current gain ($h_{21}$) and unilateral gain (U) of a HEMT-only structure and of an integrated HEMT+HBAR structure in accordance with the present invention.

The plot in FIG. 8 shows the current gain ($h_{21}$) and unilateral gain (U), measured as a function of frequency up to 5 GHz, of an HEMT only and an integrated HEMT+HBAR structure in accordance with the present invention. While passive mechanical resonators can only attenuate RF signals, a combined resonator and amplifier pair can not only provide RF signal processing, but also terminal signal gain in the same device structure over a wide bandwidth.

ADVANTAGES AND NEW FEATURES

A fully epitaxial acoustic device in accordance with the present invention has several advantages over its non-epitaxial counterparts.

First, epitaxial growth methods have excellent thickness and uniformity control, which is essential for precise frequency control. The quality of ultrathin (sub-micron thick) epitaxial films is far superior to sputter-deposited or sol-gel deposited thin films. The single-crystal epitaxial thin films have the lowest material loss as compared to the sputter deposited polycrystalline alternatives, due to smooth surfaces and clean interfaces, the lack of grain boundaries, and a lower defect density in the constituent materials. For high performance acoustic devices, these factors are critical in achieving high values of Q and f×Q.

Epitaxial growth of all layers gives better control over crystalline phase and orientation, thus making it possible to achieve the highest value of $k^2$ for a given material combination.

Good control of crystalline phase and orientation also reduce the likelihood of coupling input energy into unwanted acoustic modes.

The low-defect density single crystal heterostructure with III-N layers and metallic TMN interlayers on a SiC or diamond substrate provides excellent thermal conductivity for improved power handling.

This multi-functional heterostructure enables the integration of phononic/electronic/photonic/semiconducting/superconducting elements and any combinations thereof, seamlessly on the same substrate. The number of viable materials for each layer (substrate, TMN, III-N) provides design and performance flexibility.

The epi-HBARs have demonstrated extremely high performance, with Q values as high as 13.6 million at a frequency (f) of 10 GHz (an f×Q product of $1.36 \times 10^{17}$ Hz) at 7.2 K. This high f×Q product translates to phonon lifetimes as high as 500 µs. See Gokhale et al, *Nature Communications, supra*.

Acoustic impedance matching between layers in an acoustic device is an important parameter in resonator design, and may be specific to the design or application. For instance, in an FBAR device, the metal electrodes should be optimized to have large acoustic impedance mismatch with the piezoelectric layer to improve transduction efficiency and reduce loss. Conversely, in an HBAR device, the entire transducer stack (metal-piezoelectric-metal stack) should have minimal acoustic impedance mismatch with respect to the substrate in order to improve power transfer efficiency and minimize losses. The heterostructure approach shown here enable the integration of various substrates and various multi-functional thin film materials with acoustic impedance matching appropriate for specific applications, without sacrificing film quality. See V. J. Gokhale, et al., "Engineering Efficient Acoustic Power Transfer in HBARs and Other Composite Resonators," *Journal of Microelectromechanical Systems*, pp. 1-6, 2020.

A recently proposed quantum acoustodynamic (QAD) computing architecture envisions a one or more qubits coupled to multiple nanomechanical resonators, with the goals of improving computational efficiency and reducing the architecture's technological complexity and computational bottlenecks. See P. Arrangoiz-Arriola et al., "Microwave Quantum Acoustic Processor," *IEEE MTT-S International Microwave Symposium (IMS)* 255-258 (IEEE 2019). From a practical perspective, such a QAD architecture should have a compact form factor with electronic drive/readout interfaces. A critical requirement is an ensemble of electrically pumped phonon sources with high coherence, low crosstalk (i.e., sharp linewidths and clear mode separation), and a spectral range that allows for easy coupling with qubits.

Unlike conventional low-frequency flexural/SAW/BAW resonators, the HBAR of the present invention results in a large number of sharp periodically spaced phonon modes. The HBAR can be thought of as a geometrically compact ensemble of m spectrally periodic electrically pumped phonon sources, where each $m^{th}$ mode can be individually addressed by a qubit at the corresponding frequency. While an ensemble of individual resonators might suffer from variations across the ensemble, the modes of an HBAR have a strict and predictable internal relationship.

Thus, multiple identical modes of an HBAR could be coupled to multiple superconducting qubits fabricated on the same substrate to form the basis for a QAD processing architecture envisioned in P. Arrangoiz-Arriola et al, supra. The use of an epi-HBAR instead of a conventional HBAR would improve the coherence of the phonons, thus increasing the time available to perform quantum computations. The use of epitaxial superconductors would enable the monolithic integration of the epi-HBARs and the superconducting qubits on the same substrate.

ALTERNATIVES

In addition to the HBAR device detailed above, alternative configurations for BAW resonators made using the TMN/PO/III-N/TMN heterostructure may be made. For example, in some such configurations, the PO layer can be substituted for or added to the III-N layer as appropriate for the application.

Figure 9A:
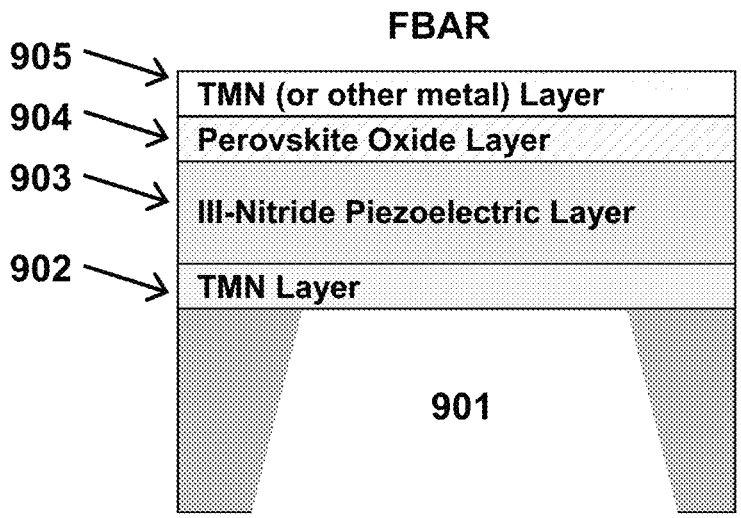
FIGS. 9A-9C are block schematics illustrating additional exemplary embodiments of BAW resonators that can be fabricated in accordance with one or more aspects of the present invention.
Figure 9B:
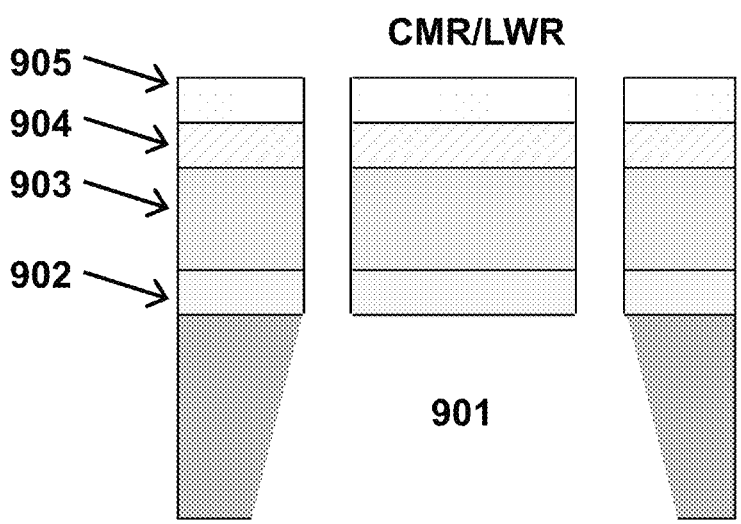
Figure 9C:
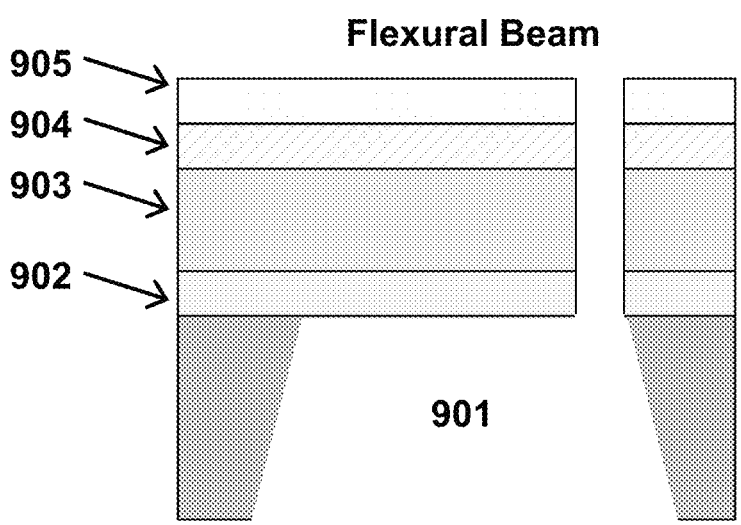

The block schematics in FIGS. 9A-9C illustrate aspects of some exemplary embodiments of other types of BAW resonators that can be made using the TMN/PO/III-N/TMN heterostructure.

A film bulk acoustic resonator (FBAR) is a thin metal-piezoelectric-metal membrane clamped along its edge, that vibrates efficiently in the vertical, out-of-plane direction at frequencies inversely proportional to thickness. Such an FBAR can be fabricated from the same basic HBAR heterostructure described above. The block schematic in FIG. 9A illustrates the original HBAR structure described above, comprising a first TMN layer 902 on a substrate 901, a III-Nitride (III-N) layer 903 disposed on the TMN layer, a perovskite oxide layer 904 disposed on the III-N layer, and a second TMN (or other metal) layer 905 disposed on the perovskite oxide layer, where each of the layers is epitaxially grown on the layer preceding it in the stack. In this embodiment, however, instead of being a solid substrate, in the FBAR structure, a section of the substrate 901 is removed, e.g., by etching or ion milling, to create a thin suspended TMN/PO/III-N/TMN membrane, thereby transforming the structure from an ordinary HBAR into an FBAR.

An exemplary embodiment of another type of BAW is illustrated by the block schematic shown in FIG. 9B. Such a device, referred to as a length/width extensional resonator, also called the contour mode resonator (CMR) or the Lamb wave resonator (LWR), can be fabricated by the appropriate patterning and etching of the TMN/III-N/TMN stack to remove areas of the stack, followed by selective removal of the substrate in a manner similar to the FBAR process described above with respect to FIG. 9A to create a resonator suspended by discrete tethers and vibrates in the plane of the film. See Rais-Zadeh et al., supra.

In an additional embodiment, an HBAR structure in accordance with the present invention can be configured as a flexural beam resonator, where the flexural beam resonator can be designed as fixed-fixed, free-free or fixed-free configurations so as to vibrate in various bending and torsional modes.

The block schematic in FIG. 9C illustrates an exemplary configuration of such a flexural beam resonator, in which the TMN/III-N/TMN heterostructure described above with respect to FIG. 9A is further etched in accordance with various mechanical boundary conditions (fixed-free, fixed-fixed, fixed-free) so that it undergoes bending or torsional vibration.

In such configurations, as illustrated in FIG. 9C, the mechanically free portion of the heterostructure can be designed to have minimal stress gradients to prevent buckling, curling or cracking. Further, appropriate optimization of the III-N, PO, and TMN layers can be used to reduce the temperature coefficient of frequency (TCF) of the overall structure. Wurtzite nitrides generally have negative TCF values, oxides and metals often have positive TCF values, and the use of a compensating oxide layer is a common method used to reduce or effectively eliminate TCF and hence make acoustic devices that are invariant in frequency over large temperature ranges. See B. Kim et al., "Frequency stability of wafer-scale film encapsulated silicon based MEMS resonators," *Sensors and Actuators A: Physical*, vol. 136, pp. 125-131, 2007; V. A. Thakar et al., "Piezoelectrically Transduced Temperature-Compensated Flexural-Mode Silicon Resonators," *Journal of Microelectromechanical Systems*, vol. 22, pp. 815-823, 2013; and C. Lin et al., "Temperature-compensated aluminum nitride lamb wave resonators," *IEEE Transactions on Ultrasonics, Ferroelectrics, and Frequency Control*, vol. 57, pp. 524-532, 2010.

Figure 10:
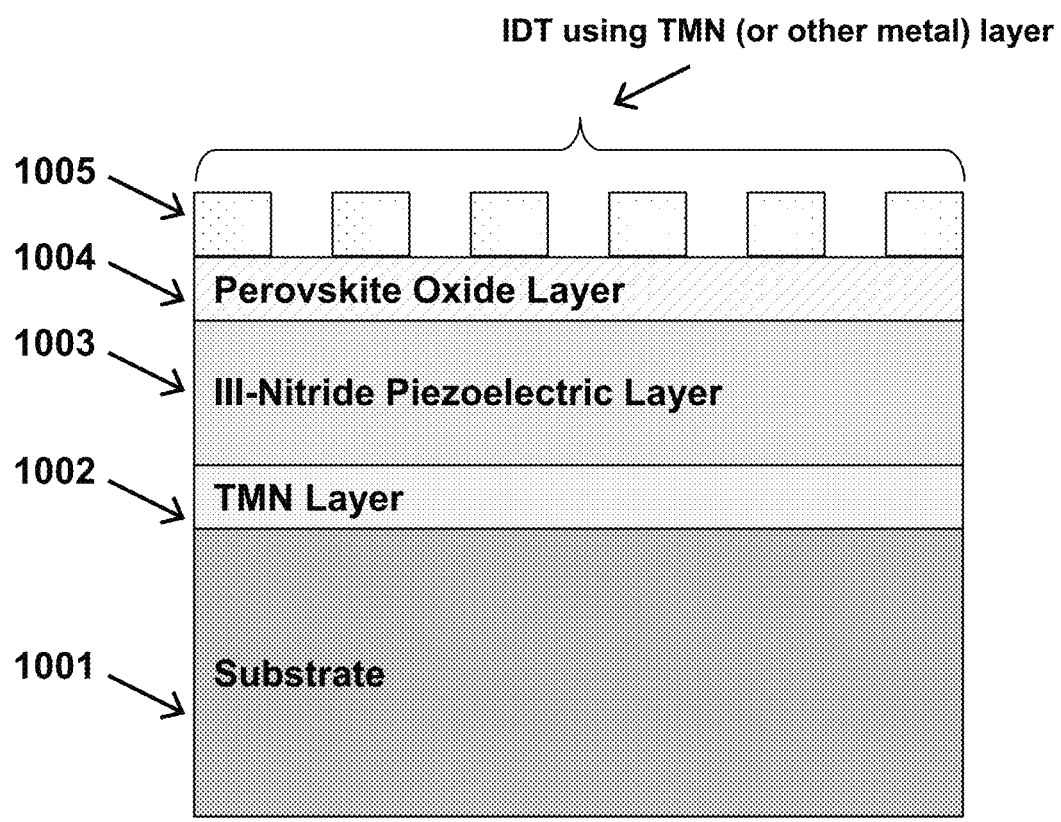
FIG. 10 is a block schematic illustrating an exemplary TMN/PO/III-N/TMN heterostructure can be used to make surface acoustic wave (SAW) devices in accordance with one or more aspects of the present invention

The TMN/PO/III-N/TMN heterostructure can also be used to make SAW devices, as illustrated by the block schematic in FIG. 10.

As illustrated in FIG. 10, such a device includes the basic epitaxial heterostructure described above, i.e., a TMN layer 1002 formed on an upper surface of a substrate 1001, a III-Nitride piezoelectric layer 1003 formed on the upper surface of the TMN layer, and a perovskite oxide layer 1004 formed on the upper surface of the III-Nitride layer. The structure further includes a top electrode layer 1005, where the top electrode can be patterned to form an interdigitated transducer (IDT), which is the basis for SAW devices such as SAW cavity resonators and SAW delay lines.

Thus, in SAW devices, the top electrode is patterned to form interdigitated transducer (IDT) pairs, where the wavelength and the spectral characteristics are primarily set by the spatial pitch of these IDT pairs. See K. Hashimoto et al., "High-performance surface acoustic wave resonators in the 1 to 3 GHz range using a ScAlN/6H—SiC structure," *IEEE Transactions on Ultrasonics, Ferroelectrics, and Frequency Control*, vol. 60, pp. 637-642, 2013; see also C. C. W. Ruppel, "Acoustic Wave Filter Technology—A Review," *IEEE Transactions on Ultrasonics, Ferroelectrics, and Frequency Control*, vol. 64, pp. 1390-1400, 2017.

The ratio of piezoelectric thickness to the IDT pitch in such devices is critical in determining the coupling coefficient. The surface waves predominantly travel along the top surface of the piezoelectric layer, and decay sharply into the thickness of the heterostructure. The effect of surface roughness and the interface quality between the top TMN layer and the piezoelectric layer are key factors in determining the mechanical loss of the surface wave.

While the bottom TMN layer is not necessary for SAW operation, it has been shown that having a bottom electrode under the piezoelectric layer confines the electric field of an input signal more efficiently, leading to more efficient SAW transduction. See Q. Zhang et al., "Surface acoustic wave propagation characteristics of ScAlN/diamond structure with buried electrode," in *Proceedings of the 2014 Symposium on Piezoelectricity, Acoustic Waves, and Device Applications*, 2014, pp. 271-274; and A. Qamar et al., "Solidly Mounted Anti-Symmetric Lamb-Wave Delay Lines as an Alternate to SAW Devices," *IEEE Electron Device Letters*, vol. 39, pp. 1916-1919, 2018.

In all instances of BAW and SAW devices in accordance with the present invention, contact to the bottom electrode can be easily achieved by etching through the PO and/or III-N films and using contact vias.

Figure 11A:
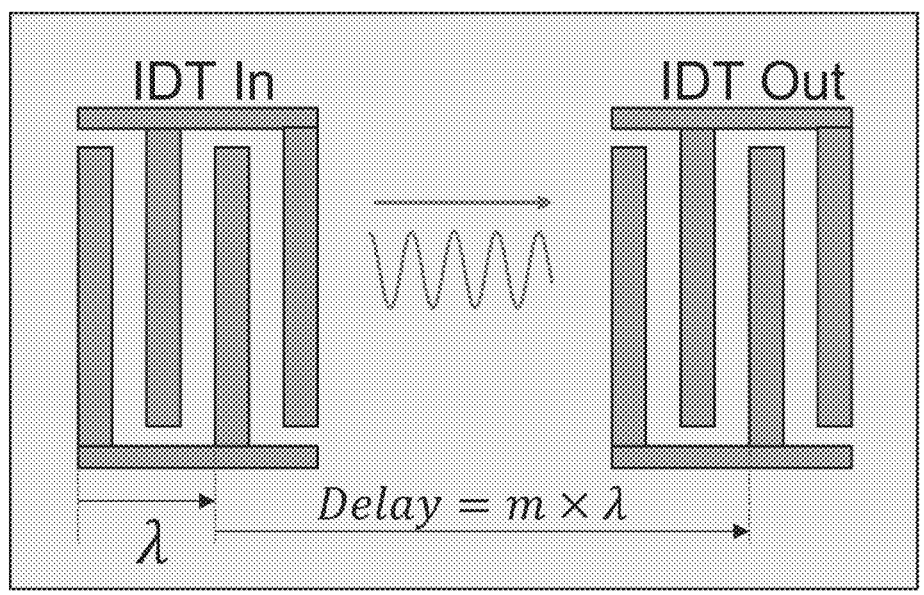
FIGS. 11A and 11B show the measured transmission response of an exemplary GaN/NbN/SiC SAW delay line with aluminum interdigitated transducers (IDTs) defined by patterning and metal lift-off.
Figure 11B:
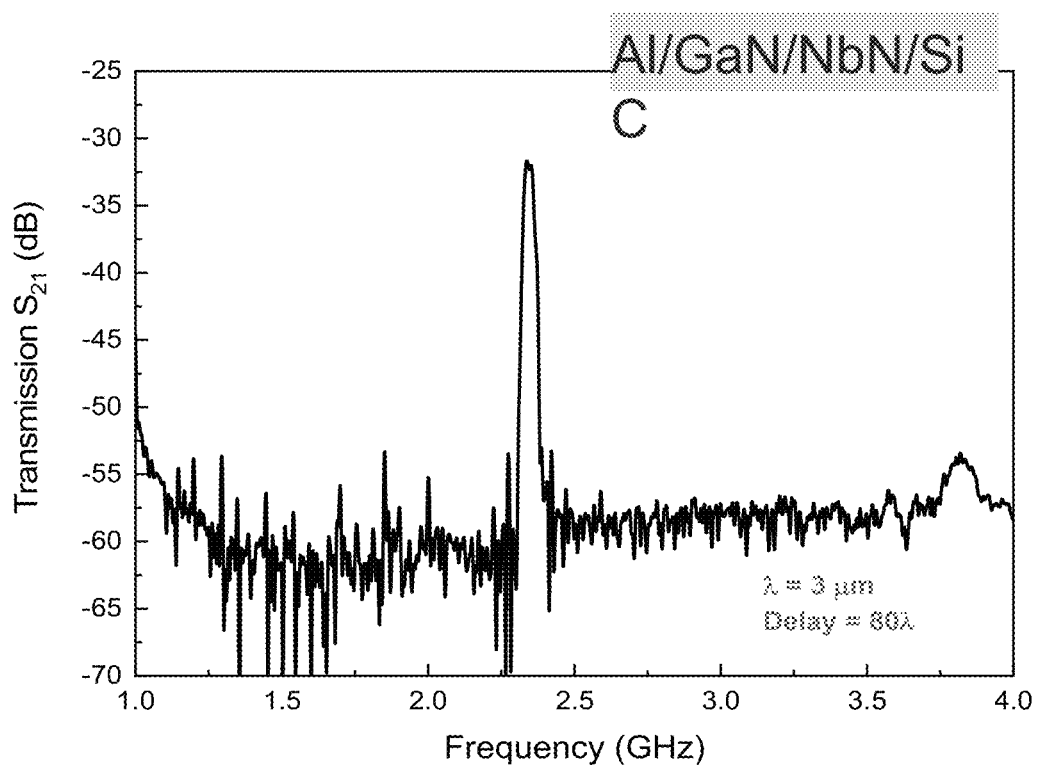

The plots in FIGS. 11A and 11B show the measured transmission response of an exemplary GaN/NbN/SiC SAW delay line with Al interdigitated transducers (IDTs) defined by patterning and metal lift-off.

Although particular embodiments, aspects, and features have been described and illustrated, one skilled in the art would readily appreciate that the invention described herein is not limited to only those embodiments, aspects, and features but also contemplates any and all modifications and alternative embodiments that are within the spirit and scope of the underlying invention described and claimed herein. The present application contemplates any and all modifications within the spirit and scope of the underlying invention described and claimed herein, and all such modifications and alternative embodiments are deemed to be within the scope and spirit of the present disclosure.

What is claimed is:

1. An acoustic wave device, comprising:
   a low-acoustic-loss substrate;
   a bottom electrode comprising a first epitaxial transition metal nitride (TMN) layer;
   a top electrode comprising a second epitaxial TMN layer; and
   at least one intermediate layer disposed between the first and second epitaxial TMN layers, the at least one intermediate layer comprising a $SrCaTiO_3$ perovskite oxide (PO) layer.

2. The acoustic wave device according to claim 1, wherein the first and second TMN layers comprise $NbN_x$ or $TaN_x$.

3. The acoustic wave device according to claim 1, wherein the second TMN layer is patterned to form an interdigitated transducer (IDT) such that the acoustic wave device forms a surface acoustic wave (SAW) device.

4. A high overtone bulk acoustic resonator (HBAR) device, comprising:
   a low-acoustic-loss substrate;
   a bottom electrode comprising an epitaxial transition metal nitride (TMN) layer;
   a top metal electrode;
   an epitaxial III-Nitride (III-N) piezoelectric layer disposed between the top and bottom electrodes; and
   an AlN layer disposed between the bottom electrode and the III-N piezoelectric layer.

5. The HBAR device according to claim 4, wherein the bottom electrode comprises $NbN_x$.

6. The HBAR device according to claim 4, wherein the top electrode comprises aluminum (Al).

7. The HBAR device according to claim 4, wherein the III-N piezoelectric layer comprises GaN.

8. The HBAR device according to claim 4, wherein the AlN layer disposed between the bottom electrode and the III-N piezoelectric layer comprises ScAlN.

9. An integrated HEMT+HBAR acoustic device comprising a high-electron-mobility transistor (HEMT) having a high overtone bulk acoustic resonator (HBAR) integrated therewith;
   wherein the HBAR comprises:
     a low-acoustic-loss substrate;
     a bottom metal electrode comprising an epitaxial transition metal nitride (TMN) layer;
     a top metal electrode;
     an epitaxial III-Nitride (III-N) piezoelectric layer between the top and bottom metal electrodes; and
     an AlN layer disposed between the bottom metal electrode and the III-N piezoelectric layer.

10. The integrated HEMT+HBAR acoustic device according to claim 9, wherein the bottom electrode comprises NbNx.

11. The integrated HEMT+HBAR acoustic device according to claim 9, wherein the top metal electrode comprises aluminum (Al).

12. The integrated HEMT+HBAR acoustic device according to claim 9, wherein the III-N piezoelectric layer comprises GaN.

13. The integrated HEMT+HBAR acoustic device according to claim 9, wherein the AlN layer disposed between the bottom electrode and the III-N piezoelectric layer comprises ScAlN.

\* \* \* \* \*